US012561505B2

(12) United States Patent
Sasaki

(10) Patent No.: US 12,561,505 B2
(45) Date of Patent: Feb. 24, 2026

(54) INFORMATION PROCESSING APPARATUS, INTEGRATED CIRCUIT, AND INFORMATION PROCESSING METHOD

(71) Applicant: FUJIFILM Business Innovation Corp., Tokyo (JP)

(72) Inventor: Hirofumi Sasaki, Kanagawa (JP)

(73) Assignee: FUJIFILM Business Innovation Corp., Tokyo (JP)

( * ) Notice: Subject to any disclaimer, the term of this patent is extended or adjusted under 35 U.S.C. 154(b) by 614 days.

(21) Appl. No.: 17/860,107

(22) Filed: Jul. 8, 2022

(65) Prior Publication Data

US 2023/0315961 A1     Oct. 5, 2023

(30) Foreign Application Priority Data

Mar. 29, 2022     (JP) ................................. 2022-054359

(51) Int. Cl.
*G06F 30/343* (2020.01)
*G06F 11/25* (2006.01)
*G06F 11/267* (2006.01)
*G06F 30/3308* (2020.01)
*G06F 30/331* (2020.01)
(Continued)

(52) U.S. Cl.
CPC ............ *G06F 30/343* (2020.01); *G06F 11/25* (2013.01); *G06F 11/261* (2013.01); *G06F 11/267* (2013.01); *G06F 30/3308* (2020.01); *G06F 30/331* (2020.01); *G06F 30/333* (2020.01); *G06F 30/367* (2020.01); *G06F 30/398* (2020.01)

(58) Field of Classification Search
CPC .... G06F 30/343; G06F 30/331; G06F 30/333; G06F 30/367; G06F 30/398; G06F 30/3308; G06F 11/25; G06F 11/261; G06F 11/267
USPC ..... 716/136, 106, 112, 116; 703/16; 714/30, 714/33, 732, 733, 734, 741
See application file for complete search history.

(56) References Cited

U.S. PATENT DOCUMENTS 6,286,114 B1     9/2001 Veenstra et al.
6,460,148 B2     10/2002 Veenstra et al.
(Continued)

FOREIGN PATENT DOCUMENTS

DE     102015213510 A1 *     1/2016     ......... G01R 31/3177
DE     102019001996 A1 *     9/2019     ......... G01D 5/24466
(Continued)

OTHER PUBLICATIONS

"Notice of Reasons for Refusal of Japan Counterpart Application", issued on Dec. 9, 2025, with English translation thereof, p. 1-p. 5.

*Primary Examiner* — Phallaka Kik
(74) *Attorney, Agent, or Firm* — JCIPRNET

(57) ABSTRACT
An information processing apparatus includes an integrated circuit that is capable of reconfiguring a logic circuit, executes data processing, and in a case where an error is generated in the data processing, acquires signal data from an acquisition target position set for a circuit portion that performs the data processing, and then outputs the signal data, a narrowing-down unit that narrows down an analysis target depending on the generated error, and a change unit that changes the acquisition target position depending on a result of a narrowing down by the narrowing-down unit after the signal data is output from the integrated circuit.

9 Claims, 8 Drawing Sheets

(51) Int. Cl.
  *G06F 30/333*      (2020.01)
  *G06F 30/367*      (2020.01)
  *G06F 30/398*      (2020.01)
  *G06F 11/26*       (2006.01)

(56)            References Cited

U.S. PATENT DOCUMENTS

| | | | | |
|---|---|---|---|---|
| 6,704,889 | B2 | 3/2004 | Veenstra et al. | |
| 2016/0057305 | A1 * | 2/2016 | Suzuki | H04N 1/00912 |
| | | | | 358/1.13 |
| 2016/0202757 | A1 * | 7/2016 | Miao | G06V 40/193 |
| | | | | 348/78 |
| 2016/0364913 | A1 * | 12/2016 | Montaigne | G06T 19/006 |
| 2017/0192691 | A1 * | 7/2017 | Zhang | H03M 13/6502 |
| 2020/0070346 | A1 * | 3/2020 | Oaki | B25J 9/1664 |
| 2021/0318940 | A1 * | 10/2021 | Shimbo | G06F 11/2242 |

FOREIGN PATENT DOCUMENTS

| | | | | | |
|---|---|---|---|---|---|
| EP | 3873087 | A2 * | 9/2021 | ....... | G06K 19/07732 |
| JP | H11296403 | | 10/1999 | | |
| JP | 2009230350 | | 10/2009 | | |
| JP | 2012114846 | A * | 6/2012 | | |
| JP | 2012137831 | | 7/2012 | | |
| JP | 2016062351 | | 4/2016 | | |
| JP | 2018180982 | | 11/2018 | | |
| WO | WO-2020059347 | A1 * | 3/2020 | ............. | G06F 11/16 |
| WO | WO-2020090034 | A1 * | 5/2020 | ............. | G05B 9/03 |

* cited by examiner rst_n int_sts                  0x0                    0x1 int_mask_sts             0x0                    0xF

Data_req_n

Data_valid_n

Data                     0x0

Req_cnt_en

Req_cnt        0x0      XXXXXXXXXXXXXXXXXXXXXX    0x30

Req_cnt_th              0x30                   0x00

Sw_rst_n

INFORMATION PROCESSING APPARATUS, INTEGRATED CIRCUIT, AND INFORMATION PROCESSING METHOD

CROSS-REFERENCE TO RELATED APPLICATIONS

This application is based on and claims priority under 35 USC 119 from Japanese Patent Application No. 2022-054359 filed Mar. 29, 2022.

BACKGROUND

(i) Technical Field

The present invention relates to an information processing apparatus, an integrated circuit, and an information processing method.

(ii) Related Art

In order to perform analysis and debugging of an internal operation of the field programmable gate array (FPGA), signals between elements inside the FPGA are extracted and analyzed by using a logic analyzer.

JP2016-62351A discloses a monitor circuit that is mounted on a semiconductor apparatus such as an FPGA, monitors an internal state of the semiconductor apparatus, and transmits a signal representing the obtained internal state to an external logic analysis terminal.

JP1999-296403A discloses a configuration capable of capturing a signal both before and after a trigger condition (breakpoint) by embedding a logic analyzer in a programmable logic device.

SUMMARY

In a case where a logic analyzer is mounted on the FPGA and the internal state of the FPGA is analyzed by using the logic analyzer, since the number of signals that can be extracted from the FPGA and the time width are limited, the signals necessary for the analysis cannot be obtained. For example, there are cases where an acquisition location of an internal waveform acquired when an abnormality occurs does not match a location where the abnormality occurred and cannot be used for the analysis. Further, there are cases where the time width that is effective for the analysis cannot be obtained for the abnormality that requires a signal with a certain length of time for the analysis.

Aspects of non-limiting embodiments of the present disclosure relate to an information processing apparatus, an integrated circuit, and an information processing method that are capable of acquiring a signal necessary for analysis depending on an abnormality that has occurred as compared with a configuration in which a signal is acquired from a fixedly set location of a circuit in the FPGA.

Aspects of certain non-limiting embodiments of the present disclosure overcome the above disadvantages and/or other disadvantages not described above. However, aspects of the non-limiting embodiments are not required to overcome the disadvantages described above, and aspects of the non-limiting embodiments of the present disclosure may not overcome any of the disadvantages described above.

According to an aspect of the present invention, there is provided an information processing apparatus including an integrated circuit that is capable of reconfiguring a logic circuit, executes data processing, and in a case where an error is generated in the data processing, acquires signal data from an acquisition target position set for a circuit portion that performs the data processing, and then outputs the signal data, a narrowing-down unit that narrows down an analysis target depending on the generated error, and a change unit that changes the acquisition target position depending on a result of a narrowing down by the narrowing-down unit after the signal data is output from the integrated circuit.

BRIEF DESCRIPTION OF THE DRAWINGS

Exemplary embodiment(s) of the present invention will be described in detail based on the following figures, wherein:

FIG. 3A is a diagram showing a connection relationship between a data acquisition unit and a module, and FIG. 3B is a diagram showing the acquired waveform data;

FIG. 4A is a diagram showing the connection relationship between the data acquisition unit and the module, and FIG. 4B is a diagram showing the acquired waveform data;

DETAILED DESCRIPTION

Hereinafter, an exemplary embodiment of the present invention will be described in detail with reference to the accompanying drawings.

Configuration of System

The present exemplary embodiment is applied to an information processing apparatus that includes an FPGA. The information processing apparatus to be applied may be an apparatus having an FPGA as a processor, and the type of the apparatus is not particularly limited. Hereinafter, a case where an image forming apparatus is used as an example of the information processing apparatus will be described.

Configuration of Apparatus

Figure 1:
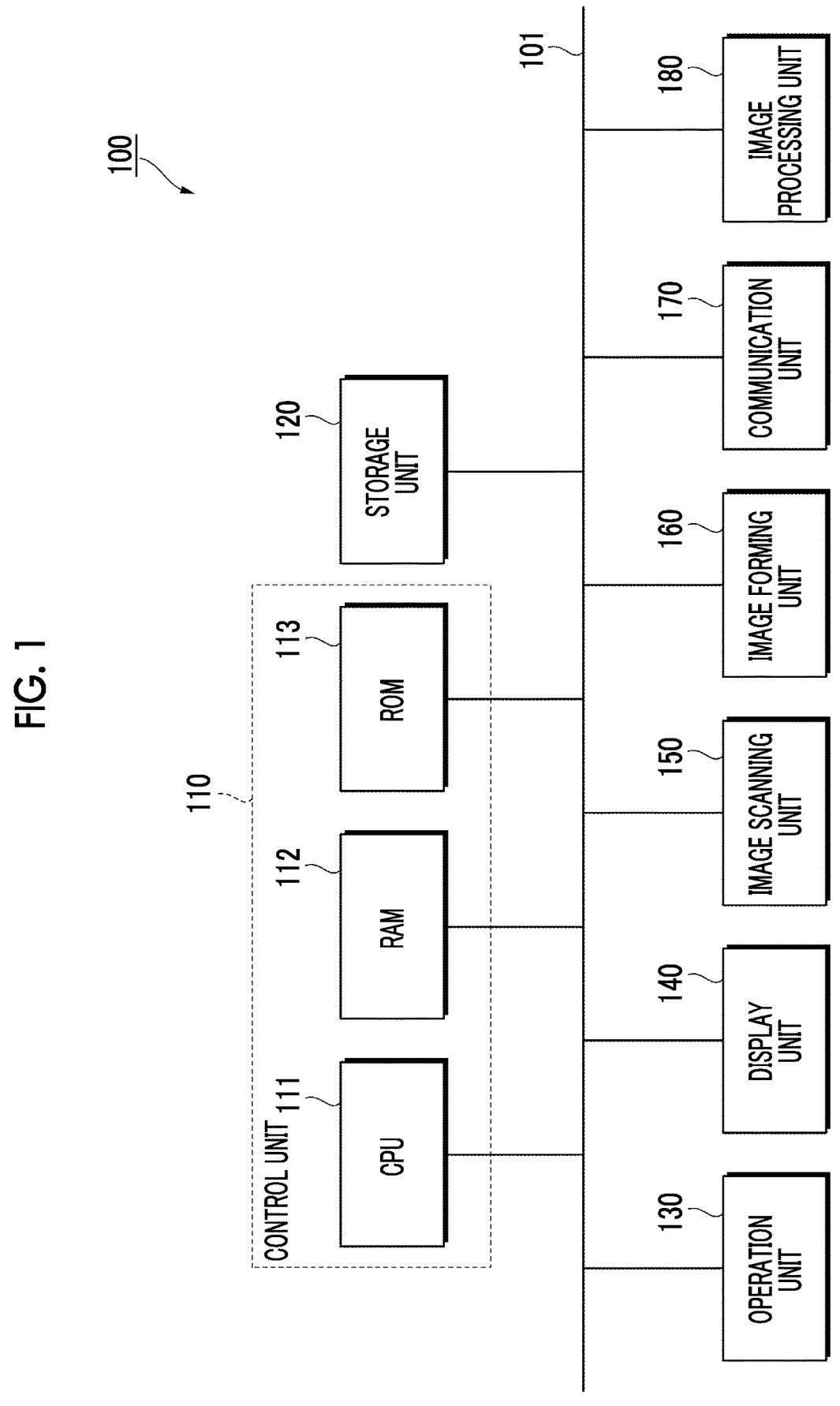
FIG. 1 is a diagram showing an example of a configuration of an image forming apparatus to which the present exemplary embodiment is applied.

FIG. 1 is a diagram showing a configuration of the image forming apparatus to which the present exemplary embodiment is applied. The image forming apparatus 100 includes a control unit 110, a storage unit 120, an operation unit 130, a display unit 140, an image scanning unit 150, an image forming unit 160, a communication unit 170, and an image processing unit 180. Each of these functional units is connected to a bus 101 and performs reception of data via the bus 101.

The control unit 110 controls each of the above-mentioned functional units in the image forming apparatus 100. Further, the control unit 110 is a functional unit that executes various data processing. The control unit 110 includes a central processing unit (CPU) 111 which is a calculator, and a random access memory (RAM) 112 and a read only memory (ROM) 113 which are memories. The RAM 112 is a main storage device (main memory) and is used as a working memory in a case where the CPU 111 performs calculation processing. Data such as a program or a set value prepared in advance is stored in the ROM 113, and the CPU 111 directly reads the program or the data from the ROM 113 and executes processing. Further, the program or data is also stored in the storage unit 120. The CPU 111 reads the program stored in the storage unit 120 into the RAM 112 and executes the program.

In the present exemplary embodiment, the CPU 111 of the control unit 110 reads and executes the program to implement various functions described later. Functions that are implemented in the present exemplary embodiment include determination of the type of error generated in processing by the FPGA device, selection of configuration data of the FPGA according to the content of the error, and the like.

The storage unit 120 is a functional unit that stores the program or data for the CPU 111 to execute as described above and also stores various data, which is generated by various operations, such as image data scanned by an image scanning unit 150. The storage unit 120 is implemented by, for example, a storage device such as a magnetic disk device or a solid state drive (SSD).

The operation unit 130 is a functional unit that receives a user operation. The operation unit 130 is configured with, for example, a hardware key, a touch sensor that outputs a control signal according to a position pressed or touched by a finger, or the like. The operation unit 130 may be configured as a touch panel in which a touch sensor and a liquid crystal display constituting the display unit 140 are combined.

The display unit 140 is a functional unit that displays an information image that presents various information to a user, a preview image of an image to be processed such as scanning or outputting, an operation image for the user to perform an operation, and the like. The display unit 140 is configured with, for example, a liquid crystal display. The operation unit 130 and the display unit 140 can be combined and used as a user interface for the user to input and output information to and from the image forming apparatus 100.

The image scanning unit 150 is a functional unit that optically scans an image on a document. Examples of an image scanning method include a charge coupled device (CCD) method in which the reflected light to light emitted from a light source to a document is reduced by the lens and received by the CCDs, a contact image sensor (CIS) method in which the reflected light to light emitted from a light emitting diode (LED) light source to the document in order is received by the CIS, and the like.

The image forming unit 160 is a functional unit that forms an image based on image data on a medium such as paper by using an image forming material. An example of a method of forming an image on the medium includes an electrophotographic method of using toner as an image forming material and transferring the toner adhering to the photoconductor to a medium to form an image.

The communication unit 170 is a functional unit that transmits and receives a command or data to and from between the communication unit 170 and the external apparatus. An example of the communication unit 170 includes an interface that corresponds to a communication method with the external apparatus. The connection with the external apparatus may be made via a network or may be made via a direct connection. A communication line may be a wired line or a wireless line.

The image processing unit 180 is a functional unit that includes a processor which is a calculator and a working memory, and performs the image processing such as color correction or gradation correction on the image represented by the image data. In the present exemplary embodiment, the assumption is made that the FPGA is used as a processor that implements the function of the image processing unit 180.

Configuration of FPGA Device

Figure 2:
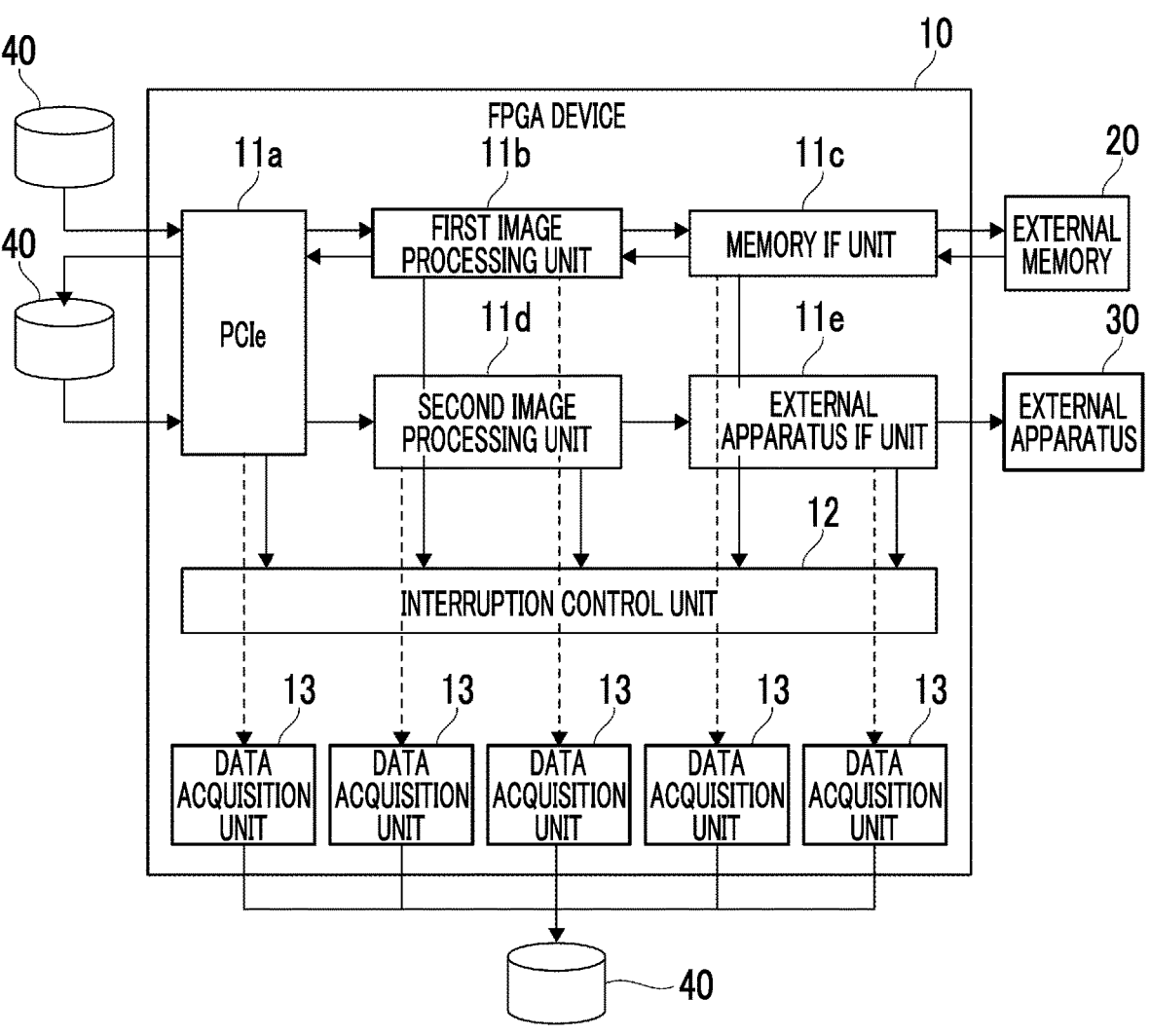
FIG. 2 is a diagram showing an example of a configuration of an FPGA device.

FIG. 2 is a diagram showing an example of a configuration of an FPGA device. The FPGA device 10 shown in FIG. 2 shows an example of being used as a device for implementing the image processing unit 180 of the image forming apparatus 100. The FPGA device 10 shown in FIG. 2 is an integrated circuit including a module group 11 that executes data processing, an interruption control unit 12, and a data acquisition unit 13. The module group 11 is an example of a calculation unit.

The module group 11 shown in FIG. 2 includes a PCIe module 11*a*, a first image processing unit 11*b*, a memory interface (IF) unit 11*c*, a second image processing unit 11*d*, and an external apparatus interface (IF) unit 11*e*. Hereinafter, in a case where each of these modules is not distinguished, these modules are described as modules 11*a* to 11*e* and the like.

The PCIe module 11*a* is a module for communicating with an external apparatus by a peripheral component interconnect-express (PCIe). In the example shown in FIG. 2, the FPGA device 10 is connected to the storage unit 120 by using the PCIe module 11*a* and performs reading and writing of an image with respect to the storage unit 120.

The first image processing unit 11*b* is one of the modules that execute the image processing in the image processing unit 180. In the example shown in FIG. 2, the first image processing unit 11*b* operates as an accelerator, for example, executes color conversion for the image to be processed, compression processing for spooling the converted image to the storage unit 120, and the like. The compressed image is spooled to the storage unit 120 via, for example, the PCIe module 11*a*.

The memory interface (IF) unit 11*c* is an interface module for connecting to the external memory 20. The external memory 20 is a work memory used in the image processing by the first image processing unit 11*b*. Examples of the external memory 20 include synchronous dynamic random access memory (SDRAM) and the like. The RAM 112 of the control unit 110 may be used as the external memory 20.

The second image processing unit 11*d* is one of the modules that execute the image processing in the image processing unit 180. In the example shown in FIG. 2, the second image processing unit 11*d* executes, for example, decompression processing of the compressed image. For example, the second image processing unit 11*d* reads the image, which is compressed by the first image processing unit 11*b* and spooled in the storage unit 120, via the PCIe module 11*a* and decompresses the image for printing out by the image forming unit 160.

The external apparatus interface (IF) unit 11*e* is an interface module for connecting to the external apparatus 30. Examples of the external apparatus 30 include an image forming unit 160. The image processed by the second image processing unit 11*d* is transmitted to the image forming unit 160 via the external apparatus IF unit 11*e* and is printed out by the image forming unit 160.

The interruption control unit 12 of the FPGA device 10 monitors each module (above described 11a to 11e in the example shown in FIG. 2) included in the module group 11. Thereafter, in a case where an invalid event occurs in the data processing due to the module group 11, the interruption control unit 12 detects the event (see the solid arrows extending from each of the modules 11a to 11e to the interruption control unit 12) and executes error interruption processing.

The data acquisition unit 13 acquires waveform data of the internal signals of the modules included in the module group 11 (see the broken line arrows extending from each of the modules 11a to 11e to the data acquisition unit 13). The data acquisition unit 13 has memory (not shown) that temporarily stores the acquired waveform data. Thereafter, the data acquisition unit 13 outputs the waveform data stored in the memory as logs. The output logs of the waveform data are stored in, for example, the storage unit 120. In FIG. 2, although a configuration that a plurality of data acquisition units 13 are provided in association with each of the modules 11a to 11e is illustrated, the configuration of the data acquisition unit 13 is not limited to the illustrated configuration. As shown in FIG. 2, the data acquisition unit 13 may be provided individually for each module, or one data acquisition unit 13 may be configured to acquire waveform data from each of the modules 11a to 11e. Hereinafter, the correspondence between the number of data acquisition units 13 and the individual modules 11a to 11e will be described without distinction.

Examples of Analysis of Acquisition Data

The logic circuit of the FPGA device 10 can be reconfigured by the FPGA device 10 reading the configuration data and rewriting the circuit configuration. In the present exemplary embodiment, the logic circuit of the FPGA device 10 is reconfigured depending on an error generated in the FPGA device 10, and the waveform data acquired at the time when the error is generated is narrowed down.

Figure 3A:
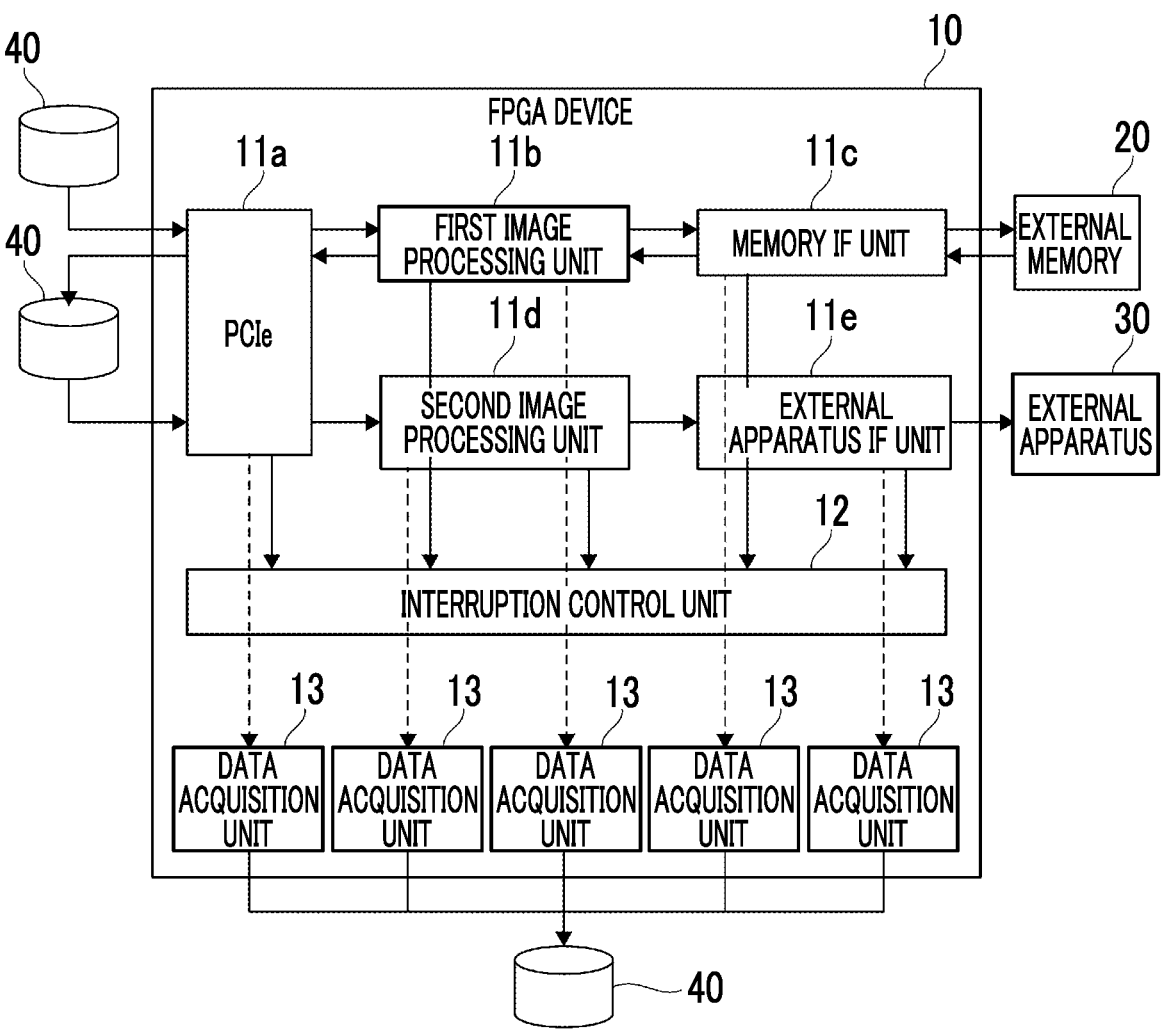
FIGS. 3A and 3B are diagrams showing an example of the FPGA device in an initial state and acquisition data.
Figure 3B:
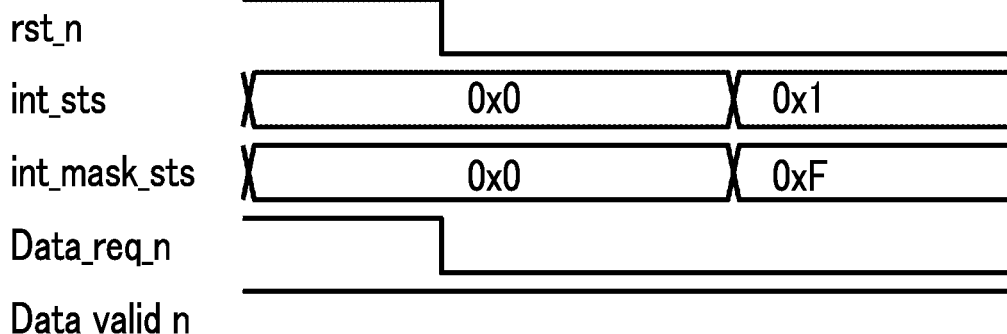

FIGS. 3A and 3B are diagrams showing an example of the FPGA device 10 in an initial state and the acquisition data. FIG. 3A is a diagram showing a connection relationship between the data acquisition unit 13 and the modules 11a to 11e, and FIG. 3B is a diagram showing the acquired waveform data. In the example shown in FIGS. 3A and 3B, the assumption is made that an error is generated in the external apparatus IF unit 11e among the modules 11a to 11e.

In the example of the configuration shown in FIG. 3A, the data acquisition unit 13 acquires the waveform data from each of the modules 11a to 11e configuring the module group 11. The data acquisition unit 13 temporarily stores the acquired waveform data in the memory and then outputs the waveform data as logs. Therefore, the amount of waveform data that the data acquisition unit 13 can temporarily store has an upper limit based on the storage capacity of the memory. According to the configuration of FIG. 3A, the data acquisition unit 13 stores the waveform data from all the modules 11a to 11e in the memory. As an example, in a case where the storage capacity of the memory of the data acquisition unit 13 is 5 KB, for example, waveform data from each of the modules 11a to 11e is stored in the memory by 1 KB.

FIG. 3B shows the acquisition data from the external apparatus IF unit 11e among the acquisition data obtained from each of the modules 11a to 11e in the FPGA device 10 shown in FIG. 3A. As described above, in the FPGA device 10 in FIG. 3A, the data acquisition unit 13 stores 1 KB of waveform data acquired from the external apparatus IF unit 11e. In the example shown in FIG. 3B, five signals are acquired, which are a reset signal (rst_n), an interruption status signal (int_sts), an interruption mask status signal (int_mask_sts), a data request signal (Data_req_n), and a data validation signal (Data_valid_n).

In the example of the configuration shown in FIG. 3, in order to store the acquisition data in the memory of 5 KB, the data acquisition unit 13 is configured to store the waveform data obtained from the five modules 11a to 11e included in the module group 11 by 1 KB each. Here, the assumption is made that a suspected location where an error is generated in the FPGA device 10, is the specific modules 11a to 11e. In this case, in order to analyze the cause of the error, the reconfiguration of the FPGA device 10 is conceivable such that more waveform data can be obtained from the specific modules 11a to 11e.

Figures 4A, 4B:
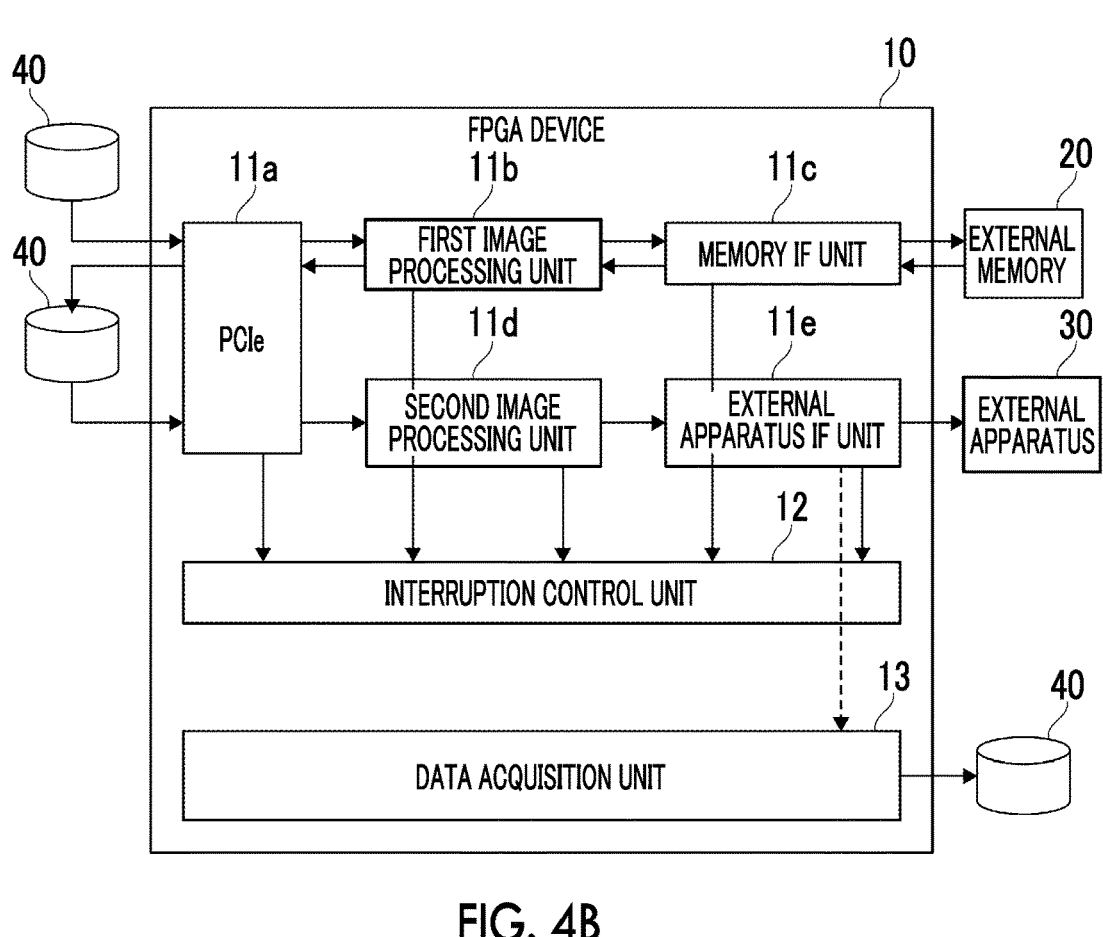
FIGS. 4A and 4B are diagrams showing an example of the reconfigured FPGA device and the acquisition data.

FIGS. 4A and 4B are diagrams showing an example of the reconfigured FPGA device 10 and acquisition data. FIG. 4A is a diagram showing a connection relationship between the data acquisition unit 13 and the modules 11a to 11e, and FIG. 4B is a diagram showing the acquired waveform data. In the example shown in FIGS. 4A and 4B, the assumption is made that an error is generated in the external apparatus IF unit 11e among the modules 11a to 11e as in the case of FIGS. 3A and 3B.

In the example of the configuration shown in FIG. 4A, the data acquisition unit 13 acquires the waveform data only from the external apparatus IF unit 11e among the modules 11a to 11e constituting the module group 11. Therefore, in a case where the storage capacity of the memory of the data acquisition unit 13 is 5 KB, by narrowing down the modules 11a to 11e which are acquisition targets (analysis targets of the error) of the waveform data, 5 KB of the waveform data from the external apparatus IF unit 11e is stored.

FIG. 4B shows the acquisition data from the external apparatus IF unit 11e of the FPGA device 10 shown in FIG. 4A. As described above, in the FPGA device 10 in FIG. 4A, the data acquisition unit 13 stores 5 KB of waveform data acquired from the external apparatus IF unit 11e. In the example shown in FIG. 4B, in addition to the five signals, which are the reset signal (rst_n), the interruption status signal (int_sts), the interruption mask status signal (int_mask_sts), the data request signal (Data_req_n), and the data validation signal (Data_valid_n) shown in FIG. 3B, five more signals are acquired, which are data (Data), a count start signal (Req_cnt_en), a count signal (Req_cnt), a count threshold value (Req_cnt_th), and a reset signal (Sw_rst_n).

In a case of referring to the acquisition data shown in FIG. 3B, the external apparatus IF unit 11e is reset by using the reset signal (rst_n), and a data request is made from the external apparatus IF unit 11e (see Data_req_n), but an error interruption has occurred (see int_sts and int_mask_sts) without the external apparatus IF unit 11e receiving the data validation signal (Data_valid_n). However, the cause of the error cannot be specified from the acquisition data shown in FIG. 3B.

On the other hand, in a case of referring to the acquisition data shown in FIG. 4B, the data request is made at the external apparatus IF unit 11e (see Data_req_n), and also clock counting is started by the counter (see Req_cnt_en and Req_cnt). In the example shown in FIG. 4B, the clock counting is performed until the number of clocks reaches the specified time (0x30) determined by using the count threshold value (Req_cnt_th) (see Req_cnt). However, since the reset signal (Sw_rst_n) is generated before the number of clocks reaches the specified time, a value of the count threshold value (Req_cnt_th) that determines the count time has returned to 0x00. Therefore, the interruption control unit 12 recognizes that the specified time is 0x00, determines that the data has not been received within the specified time, and performs the error interruption processing (see int_sts and int_mask_sts). Therefore, the cause of the error is an invalid reset signal (Sw_rst_n).

As described above, in the example shown in FIG. 4B, the cause of the error can be specified because the acquisition data from the external apparatus IF unit 11e is increased as compared with the example shown in FIG. 3B. In the example described with reference to FIGS. 3A, 3B, 4A, and 4B, the analysis is performed for the error in the external apparatus IF unit 11e, and the error analysis can be performed in detail with respect to the error that is generated in each of the modules 11a to 11e in the same manner by increasing the amount of the acquisition data. Further, in the above example, the analysis to specify the cause of the error is possible by increasing the number of signals of the acquisition data, and there may be a case where the cause of the error can be specified by increasing the time width (acquisition time) of the acquisition data depending on the type of the error. In this case as well, there may be a possibility that the cause of the error can be specified by increasing the assignment of the memory storage capacity of the data acquisition unit 13 with respect to the suspected location.

Reconfiguration of FPGA Device 10 and Specification of Acquisition Target Position As described above, by reconfiguring the logic circuit of the FPGA device 10 and narrowing down an acquisition position of the waveform data (hereinafter, referred to as an "acquisition target position"), the acquisition data at the acquisition target position, which is narrowed down and specified, can be increased. Therefore, in a case where an error is generated when a certain job is executed on the FPGA device 10, the FPGA device 10 is reconfigured depending on the generated error, and in a case where the same job is executed and the same error is generated next time, the acquisition data at the suspected location can be increased. Hereinafter, a method of specifying the acquisition target position in the reconfiguration of the FPGA device 10 depending on the error will be described.

First, error classification will be described. For example, the error classification is performed based on the detection of the occurrence of an error interruption in the FPGA device 10 by the control unit 110 of the image forming apparatus 100 and the logs of the acquisition data obtained in a case where the error is generated. In the present exemplary embodiment, since the acquisition target position is appropriately narrowed down depending on the error, the errors are classified into a set value error, other image processing-related errors, and a board-related error.

The set value error is an error caused by an error in the set value used in the image processing performed in the FPGA device 10. Examples of the error case that causes the set value error include an error case where the information related to the size of the image to be processed and the size of the actual image are different from each other, an error case where the size of the image to be processed and the size of the look-up table (LUT) used in the image processing are different from each other, and the like.

Examples of other image processing-related errors include data overflow or underflow in the individual modules 11a to 11e, inconsistencies in the number of packets, detection of errors by checksums, and the like.

The board-related error is an error due to a defect of the board (so to speak, hardware) in the FPGA device 10. In the case of the board-related error, since the handling by reconfiguring the FPGA device 10 is not possible, board exchange is necessary.

The control unit 110 specifies the acquisition target position as follows according to the above error classification. Firstly, in a case where an error is generated in one place of the module group 11 in the FPGA device 10, one of the modules 11a to 11e where the error is generated is set as the acquisition target position.

Secondly, in a case where errors are generated in a plurality of places in the modules 11a to 11e, and in a case where a set value error and other image processing-related errors are mixed, one of the modules 11a to 11e where the set value error is generated is set as the acquisition target position. In contrast to this, in a case where only other image processing-related errors are generated in the plurality of places in the modules 11a to 11e, and when the plurality of modules where the error are generated in the modules 11a to 11e are the modules disposed on the same processing path in the modules 11a to 11e, the module that is positioned at the most preceding stage on the processing path in the modules 11a to 11e is set as the acquisition target position.

Further, in a case where the plurality of modules where the error are generated in the modules 11a to 11e are the modules disposed on the different processing paths in the modules 11a to 11e, the assumption is made that a plurality of irrelevant errors are generated individually, thereby the determination of the acquisition target position by using the first method described above is sequentially applied to each of the modules where the error is generated in the modules 11a to 11e. Similarly, in a case where the set value errors are generated in a plurality of modules in the modules 11a to 11e, the assumption is made that a plurality of irrelevant errors are generated individually, thereby the determination of the acquisition target position by using the first method described above is sequentially applied to each of the modules where the error is generated in the modules 11a to 11e.

The reconfiguration of the FPGA device 10 is performed by the FPGA device 10 reading the configuration data and rewriting the logic circuit inside the device. Therefore, in order to select the acquisition target position and reconfigure the FPGA device 10 as described above, the configuration data is prepared in advance in which various locations in the module group 11 are set as the acquisition target positions, and the configuration data used for the reconfiguration is selected according to the type of the generated error. For example, the control unit 110 determines the type of the error and selects the configuration data. In other words, the control unit 110 narrows down the modules 11a to 11e as analysis targets (acquisition targets of the waveform data) or the signals to be acquired, according to the type of the error. The control unit 110 is an example of a narrowing-down unit. The configuration data in which various acquisition target positions are set are stored in advance in, for example, the storage unit 120. Examples of the change unit include the storage unit 120 that stores the configuration data, the FPGA device 10 that reads and reconfigures the configuration data, and the control unit 110 that controls the reconfiguration of the FPGA device 10.

Example of Reconfiguration of FPGA Device 10 Depending on Error

Examples of the reconfiguration of the FPGA device 10 that is performed depending on the generated error will be shown based on the above described method of specifying the acquisition target position with respect to the FPGA device 10.

Figure 5:
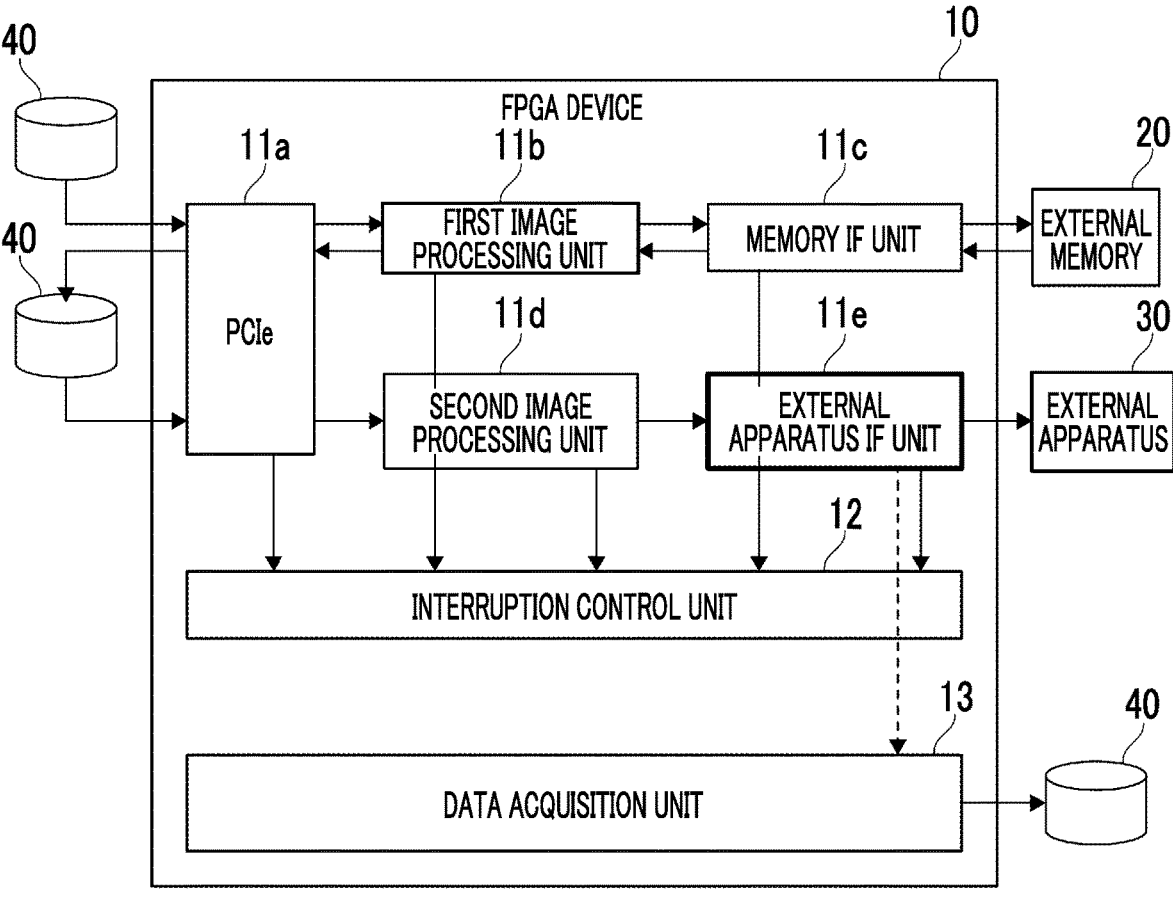
FIG. 5 is a diagram showing an example of a reconfiguration of the FPGA device depending on an error.

FIG. 5 is a diagram showing an example of the reconfiguration of the FPGA device 10 depending on an error. In the example shown in FIG. 5, among the modules 11a to 11e included in the module group 11 of the FPGA device 10, the assumption is made that an error is generated due to the underflow of the image data in the external apparatus IF unit 11e (indicated by a thick frame in the figure). Further, the assumption is made that no error is generated in the other modules 11a to 11d.

In this case, since the suspected location is the external apparatus IF unit 11e, the FPGA device 10 is reconfigured such that the data acquisition unit 13 acquires the waveform data only from the external apparatus IF unit 11e. As a result, by using the FPGA device 10 configured as shown in FIG. 5, in a case where the image forming apparatus 100 executes a job and the same error is generated in the external apparatus IF unit 11e, more waveform data than the waveform data in the initial state of the FPGA device 10 (see FIG. 3A) is acquired from the external apparatus IF unit 11e.

Figure 6:
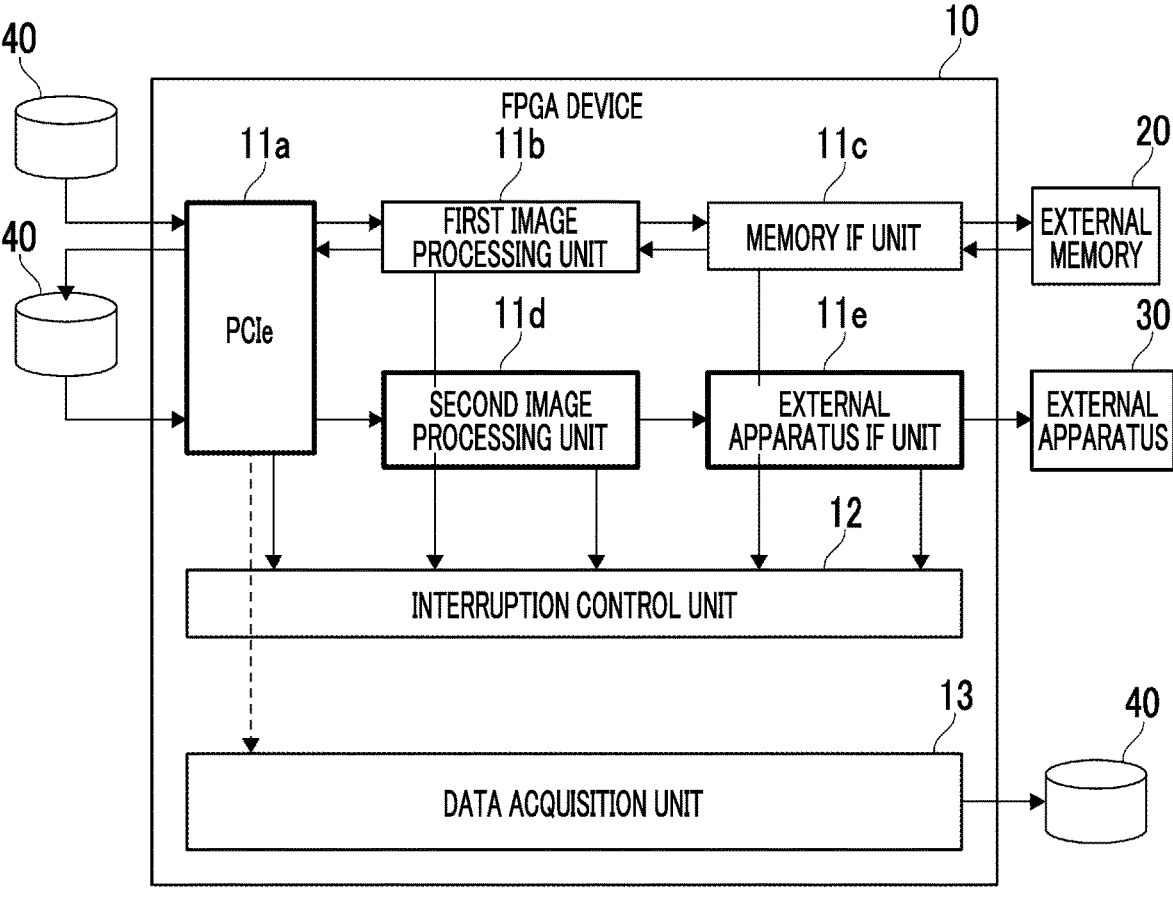
FIG. 6 is a diagram showing another example of a reconfiguration of the FPGA device depending on an error.

FIG. 6 is a diagram showing another example of the reconfiguration of the FPGA device 10 depending on an error. In the example shown in FIG. 6, among the modules 11a to 11e included in the module group 11 of the FPGA device 10, the assumption is made that errors are generated in three places of the PCIe module 11a, the second image processing unit 11d, and the external apparatus IF unit 11e (indicated by thick frames in the figure). Specifically, the assumption is made that an error due to DMA underrun is generated in the PCIe module 11a, an error due to underrun is generated in the second image processing unit 11d, and an error due to underflow of the image data is generated in the external apparatus IF unit 11e, respectively. Further, the assumption is made that no error is generated in the other modules 11b and 11c.

In this case, since the three modules 11a, 11d, and 11e where the errors are generated are disposed in the order of the PCIe module 11a→ the second image processing unit 11d→ the external apparatus IF unit 11e on the identical processing path, the PCIe module 11a that is positioned at the most preceding stage becomes the suspected location. Thereafter, the FPGA device 10 is reconfigured such that the waveform data is acquired only from the PCIe module 11a which is the suspected location. As a result, by using the FPGA device 10 configured as shown in FIG. 6, in a case where the image forming apparatus 100 executes a job and the same error is generated in the PCIe module 11a, more waveform data than the waveform data in the initial state of the FPGA device 10 is acquired from the PCIe module 11a.

Figure 7:
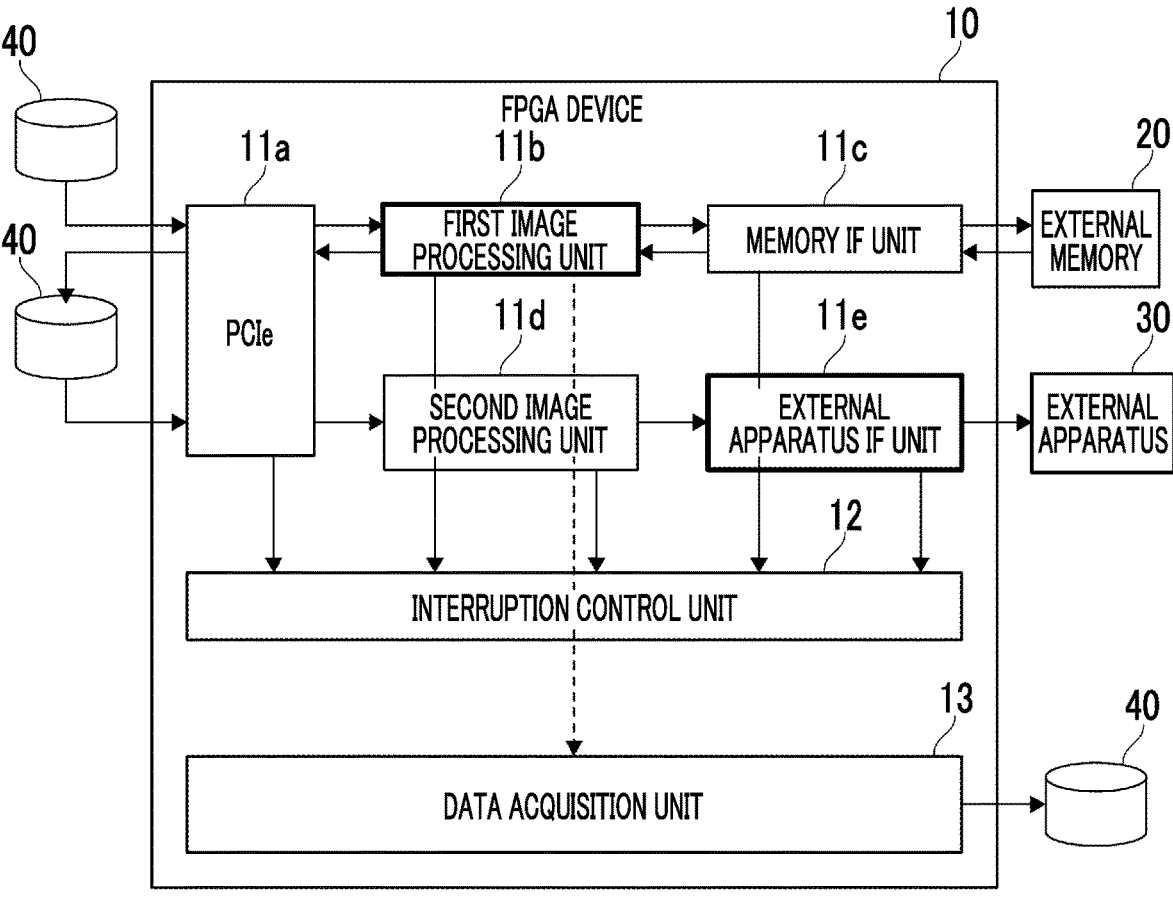
FIG. 7 is a diagram showing still another example of a reconfiguration of the FPGA device depending on an error.

FIG. 7 is a diagram showing another example of the reconfiguration of the FPGA device 10 depending on an error. In the example shown in FIG. 7, among the modules 11a to 11e included in the module group 11 of the FPGA device 10, the assumption is made that errors are generated in two places, which are the first image processing unit 11b and the external apparatus IF unit 11e (indicated by thick frames in the figure). Specifically, the assumption is made that a set value error of the LUT size is generated in the first image processing unit 11b, and an error due to the underflow of the image data is generated in the external apparatus IF unit 11e, respectively. Further, the assumption is made that no error is generated in the other modules 11a, 11c, and 11d.

In this case, the two modules 11b and 11e where the errors are generated are modules disposed on different processing paths. Since the error generated in the first image processing unit 11b is a set value error, the set value error is prioritized and the first image processing unit 11b becomes the suspected location. Thereafter, the FPGA device 10 is reconfigured such that the waveform data is acquired only from the first image processing unit 11b, which is the suspected location. As a result, by using the FPGA device 10 configured as shown in FIG. 7, in a case where the image forming apparatus 100 executes a job and the same error is generated in the first image processing unit 11b, more waveform data than the waveform data in the initial state of the FPGA device 10 is acquired from the first image processing unit 11b. In the example shown in FIG. 7, the first image processing unit 11b and the external apparatus IF unit 11e are present in different processing paths, but even in a case where these modules 11b and 11e are present on the same processing paths since the error generated in the first image processing unit 11b is a set value error, the first image processing unit 11b becomes the suspected location.

Operation of Image Forming Apparatus 100

Figure 8:
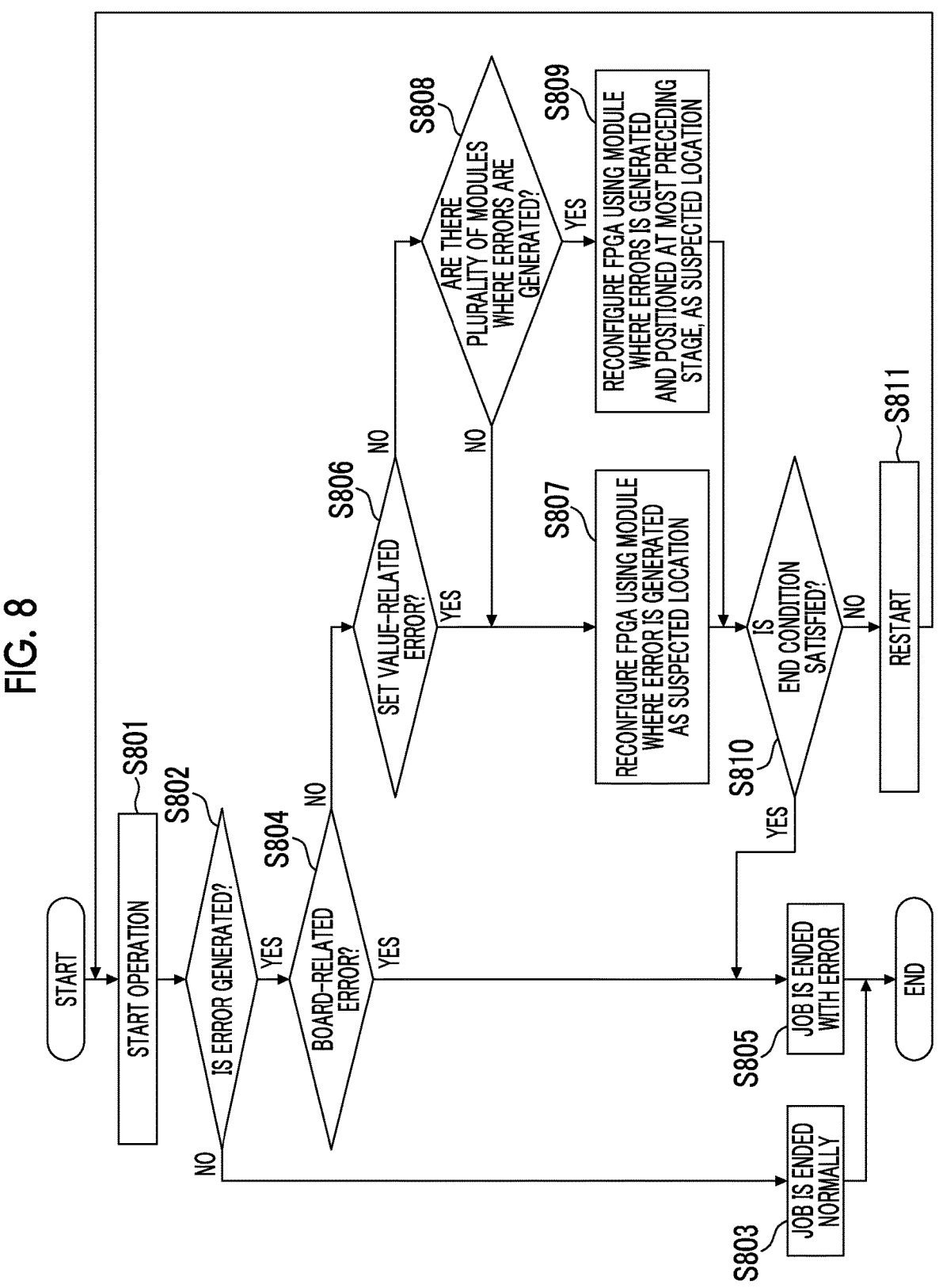
FIG. 8 is a flowchart showing an operation related to the generation of an error in the image forming apparatus.

FIG. 8 is a flowchart showing an operation related to the generation of an error in the image forming apparatus 100. First, the image forming apparatus 100 receives an execution instruction of a job and starts an operation of the instructed job (S801). In a case where no error is generated in the operation of the job (NO in S802), the image forming apparatus 100 ends the job normally (S803).

In a case where an error is generated in the operation of the job (YES in S802), the control unit 110 of the image forming apparatus 100 classifies the generated error. In a case where the generated error is the board-related error (YES in S804), the control unit 110 ends the job with an error (S805). In a case where the job is ended with an error, the control unit 110 may display, for example, a message prompting the exchange of the board on the display unit 140.

In a case where the generated error is the set value-related error (NO in S804, YES in S806), the control unit 110 reconfigures the FPGA device 10 using the module where the error is generated in the modules 11a to 11e as the suspected location (S807).

In a case where the generated error is neither a board-related error nor a set value-related error (NO in S804, NO in S806), and in a case where there is only one module where the error is generated (NO in S808), the control unit 110 reconfigures the FPGA device 10 using the module where the error is generated in the modules 11a to 11e as the suspected location (S807).

In a case where there are a plurality of modules where errors are generated on the same processing paths (YES in S808), the control unit 110 reconfigures the FPGA device 10 using the module positioned at the most preceding stage among the modules where the errors are generated in the modules 11a to 11e as the suspected location (S809).

After the reconfiguration of the FPGA device 10 as described above, the control unit 110 determines whether or not an end condition is satisfied. Here, the assumption is made that, regarding all the configuration data corresponding to the error type and error generated position, the end condition is satisfied in a case where the FPGA device 10 is reconfigured by using the configuration data. Depending on the type of the error, there may be a plurality of configurations (connection relationship between the modules 11a to 11e and the data acquisition unit 13) of the FPGA device 10 that can be used for analyzing the generated error. For example, as described with reference to FIG. 4B, there may be a case where the analysis for specifying the cause of the error becomes possible by increasing the number of signals of the acquisition data, a case where the specification of the cause of the error becomes possible by increasing the time width (acquisition time) of the acquisition data, or a case where the adequacy of the increase of the acquisition data by any policy is unclear depending on the type of the error. In such a case, acquisition and analysis of each of the logs of the waveform data for all the available configurations are necessary. Therefore, in a case where there is the configuration data that has not been used to reconfigure the FPGA device 10, which is the configuration data that can be used to analyze the generated error, the control unit 110 determines that the end condition is not satisfied and reconfigures the FPGA device 10 to which the unused configuration data is applied.

As described above, in a case where the end condition is not satisfied (NO in S810), the control unit 110 restarts the image forming apparatus 100 in which the FPGA device 10 is reconfigured (S811) and returns the process to S801. Here, the assumption is made that the FPGA device 10 is reconfigured, the image forming apparatus 100 is restarted, and then a state becomes an execution instruction wait state of the job. In the image forming apparatus 100 after the restart, the job to be executed next is not limited to the same job as the job in which the error is generated in S802. In a case where the same job is executed and the same error is generated, since the reconfiguration of FPGA device 10 is performed, more waveform data than the waveform data in the initial state of the FPGA device 10 (see FIG. 3A) can be obtained regarding the suspected location.

On the other hand, in a case where the end condition is satisfied (YES in S810), the control unit 110 does not restart the image forming apparatus 100 and ends the job with an error (S805). In the error processing, the control unit 110 may display a message indicating information related to the generated error on the display unit 140.

Although the exemplary embodiments of the present invention have been described above, the technical scope of the exemplary embodiment of the present invention is not limited to the above exemplary embodiment. For example, in the above exemplary embodiment, in a case where errors are generated in a plurality of modules on different processing paths, the assumption is made that a plurality of irrelevant errors are generated individually, and the FPGA device is sequentially reconfigured while responding individually with respect to the individual errors. In contrast to this, for example, first, the FPGA device may be reconfigured using each module where the error is generated as the acquisition target position and the waveform data is acquired, and the FPGA device 10 may be reconfigured further using individual modules as the acquisition target position as needed and the waveform data is acquired.

Further, in the above exemplary embodiment, the acquisition target position is set for each module constituting the module group that performs the data processing of the FPGA device 10, but the acquisition target position does not have to correspond to individual modules. For example, a part of the input and output of the arithmetic element included in one module may be set to the acquisition target position, or the acquisition target position may be set across a plurality of modules. In this case, the acquisition target of the waveform data is not narrowed down for each module unit, but the signal required for the error analysis is narrowed down as the analysis target (acquisition target).

Further, in the above exemplary embodiment, an example in which the image forming apparatus is used as the information processing apparatus has been described, but the application target of the present exemplary embodiment is not limited to the above example. The present exemplary embodiment can be applied to various information processing apparatuses that use the FPGA devices for at least a part of processors performing data processing, such as a server, a communication apparatus, an automobile, and a game machine. Various changes and alternative configurations that do not deviate from the scope of the technical idea of the exemplary embodiment of the present invention are included in the exemplary embodiment of the present invention.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. An information processing apparatus comprising:
an integrated circuit that is capable of reconfiguring a logic circuit, executes data processing, and in a case where an error is generated in the data processing, acquires signal data from an acquisition target position set for a circuit portion that performs the data processing, and then outputs the signal data;
a narrowing-down unit that narrows down an analysis target depending on the generated error; and
a change unit that changes the acquisition target position depending on a result of the narrowing down by the narrowing-down unit after the signal data is output from the integrated circuit.

2. The information processing apparatus according to claim 1,
wherein the narrowing-down unit narrows down a module where an error is generated in the circuit portion that performs the data processing, as the analysis target, and
the change unit sets the acquisition target position such that a signal in the module, which is narrowed down as the analysis target by the narrowing-down unit, is acquired.

3. The information processing apparatus according to claim 2,
wherein in a case where errors are generated in a plurality of modules on a processing path configured in the integrated circuit, the narrowing-down unit narrows down a module positioned at a more preceding stage on the processing path as the analysis target.

4. The information processing apparatus according to claim 3,
wherein in a case where there is a module where an error is generated based on an abnormality in a set value, the narrowing-down unit narrows down the module as the analysis target regardless of a position on the processing path.

5. The information processing apparatus according to claim 2,
wherein in a case where there is a module where an error is generated based on an abnormality in a set value, the narrowing-down unit narrows down the module where the error is generated based on the abnormality in the set value as the analysis target even in a case where there is a module where another error is generated.

6. The information processing apparatus according to claim 1, wherein the narrowing-down unit narrows down a signal necessary for analyzing the generated error as the analysis target, and the change unit sets a location, where a signal that is narrowed down as the analysis target by the narrowing-down unit is obtained, as the acquisition target position, in the circuit portion that performs the data processing.

7. The information processing apparatus according to claim 6, wherein in a case where errors are generated in a plurality of locations on a processing path configured in the integrated circuit, the narrowing-down unit narrows down a signal obtained from the location where the error is generated, which is positioned at a more preceding stage on the processing path, as the analysis target.

8. The information processing apparatus according to claim 6, wherein in a case where an error is generated based on an abnormality in a set value, the narrowing-down unit narrows down a signal obtained from a location where the error is generated based on the abnormality in the set value as the analysis target even in a case where another error is generated, which is different from the error based on the abnormality in the set value.

9. An information processing method comprising:

executing data processing, and in a case where an error is generated in the data processing, acquiring signal data from an acquisition target position set for a circuit portion that performs the data processing, and then outputting the signal data;

narrowing down an analysis target depending on the generated error; and changing the acquisition target position depending on a result of the narrowing down after the signal data is output from the integrated circuit.

* * * * *